United States Patent
Noh et al.

(10) Patent No.: US 10,217,393 B2
(45) Date of Patent: Feb. 26, 2019

(54) SOURCE DRIVER, DISPLAY DEVICE WITH THE SAME AND DRIVING METHOD THEREOF

(71) Applicant: LG Display Co., Ltd., Seoul (KR)

(72) Inventors: Ju Young Noh, Gyeonggi-do (KR); Jun Hyeok Yang, Gyeonggi-do (KR); Kyoung Don Woo, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 281 days.

(21) Appl. No.: 14/967,785

(22) Filed: Dec. 14, 2015

(65) Prior Publication Data
US 2016/0180764 A1 Jun. 23, 2016

(30) Foreign Application Priority Data

Dec. 22, 2014 (KR) ........................ 10-2014-0185805

(51) Int. Cl.
G09G 3/20 (2006.01)
H03M 1/74 (2006.01)
(Continued)

(52) U.S. Cl.
CPC ......... G09G 3/2018 (2013.01); G09G 3/2003 (2013.01); G09G 3/3688 (2013.01);
(Continued)

(58) Field of Classification Search
CPC ............... G09G 3/2018; G09G 3/3688; G09G 2310/0291; G09G 2310/027;
(Continued)

(56) References Cited

U.S. PATENT DOCUMENTS 8,022,730 B2 * 9/2011 Huang ................... H03K 5/023
326/62
2003/0043129 A1 * 3/2003 Tazuke ................. G09G 3/3688
345/204
(Continued)

FOREIGN PATENT DOCUMENTS

CN 1881401 A 12/2006
CN 102737594 A 10/2012
(Continued)

OTHER PUBLICATIONS

Communication pursuant to Article 94(3) EPC dated May 3, 2017 issued in corresponding European Patent Application No. 15197252.8.
(Continued)

Primary Examiner — Lun-Yi Lao
Assistant Examiner — Johny Lau
(74) Attorney, Agent, or Firm — Morgan, Lewis & Bockius LLP

(57) ABSTRACT

A display device includes: a display panel including pixels arranged in a matrix shape; and a source driver to apply data voltages to the pixels. The source driver includes: a shift controller to shift a sampling control signal; a latch array to sample digital video data in response to the sampling control signal shifted by the shift controller; a digital-to-analog converter array to convert the digital video data from the latch array into data voltages by decoding the digital video data and combination-outputting gamma compensation voltages on the basis of a gray value of the decoded data; an output buffer array to output the data voltages from the digital-to-analog converter array; and a bias controller to adjust a bias current, which is applied to the output buffer array, according to delay and stable intervals of the data voltage.

18 Claims, 9 Drawing Sheets

(51) Int. Cl.
*G09G 3/36* (2006.01)
*G09G 3/3275* (2016.01)

(52) U.S. Cl.
CPC .......... *H03M 1/74* (2013.01); *G09G 3/3275* (2013.01); *G09G 2310/027* (2013.01); *G09G 2310/0286* (2013.01); *G09G 2310/0289* (2013.01); *G09G 2310/0291* (2013.01); *G09G 2310/08* (2013.01); *G09G 2320/0673* (2013.01); *G09G 2330/021* (2013.01)

(58) Field of Classification Search
CPC ..... G09G 2310/0286; G09G 2330/021; G09G 2310/0289; G09G 3/2003; G09G 2310/021; G09G 310/0286; G09G 2320/0673; G09G 2310/08; G09G 3/3275; H03M 1/74
See application file for complete search history.

(56) References Cited

U.S. PATENT DOCUMENTS

| | | | | |
|---|---|---|---|---|
| 2006/0279505 A1* | 12/2006 | Nagato | ................ | G09G 3/3611 345/98 |
| 2006/0291309 A1* | 12/2006 | Maki | ................... | G09G 3/3655 365/203 |
| 2007/0115271 A1* | 5/2007 | Seo | ...................... | G09G 3/3688 345/204 |
| 2009/0179890 A1* | 7/2009 | Nishimura | ........... | G09G 3/3688 345/214 |
| 2010/0141493 A1* | 6/2010 | Cho | ........................ | G09G 3/20 341/122 |
| 2012/0013587 A1 | 1/2012 | Yen | | |
| 2012/0249244 A1 | 10/2012 | Chen et al. | | |
| 2016/0098951 A1* | 4/2016 | Kim | ..................... | G09G 3/3688 345/209 |

FOREIGN PATENT DOCUMENTS

| | | | |
|---|---|---|---|
| EP | 1 094 440 A2 | | 4/2001 |
| JP | 2013-162145 A | | 8/2013 |
| JP | 2013162145 | * | 8/2013 |

OTHER PUBLICATIONS

Extended Eurporean Search Report for Application No. 15197252.8, dated Feb. 10, 2016.

First Notification of Office Action dated Nov. 3, 2017, issued in corresponding Chinese Patent Application No. 201510971117.9.

* cited by examiner

SOURCE DRIVER, DISPLAY DEVICE WITH THE SAME AND DRIVING METHOD THEREOF

The present application claims priority under 35 U.S.C. § 119(a) of Korean Patent Application No. 10-2014-0185805 filed on Dec. 22, 2014 which is hereby incorporated by reference in its entirety.

BACKGROUND

Field of the Disclosure

The present application relates to a display device, and more particularly, to a source driver, a display device with the same and a driving method thereof which are adapted to reduce power consumption by adjusting a bias voltage applied to an output buffer of the source driver.

Description of the Related Art

A display device includes a display panel configured to display an image and drivers configured to drive the display panel. The display panel includes a plurality of data lines and a plurality of gate lines. Also, the display panel includes pixels formed in regions which are defined by the pluralities of data lines and gate lines crossing each other. The display panel can become one of a liquid crystal display panel, an organic light emitting diode display panel, an electrophoresis display panel, a plasma display panel and so on.

The drivers include a source driver and a gate driver. The source driver is used to drive the data lines on the display panel. The gate driver is used to drive the gate lines on the display panel.

The source driver includes a plurality of output buffers each configured to buffer a data voltage which is applied from a respective digital-to-analog converter. The output buffers are connected to the data lines on the display panel by ones. Also, the output buffers transfer the buffered data voltages to the respective data lines.

In this manner, the data voltages used to drive the pixels on the display panel are output through the output buffers built-in the source driver. As such, the properties of the output buffers must affect image quality of the display panel.

Recently, the display panel becomes larger size and higher definition. As such, the display panel is required to drive in a high frame frequency. Also, the source driver is configured in a multi-channel mode with several driver IC (integrated-circuit) chips. Each of the source driver IC chips can apply the data voltages to some of the data lines.

Particularly, in order to enhance the performance of the large-sized high definition display panel, the performance of the output buffer of the source driver must be enhanced. The performance of the output buffer is largely affected by a bias current which is applied to the output buffer.

FIG. 1 is a data sheet illustrating properties of an input bias current and an output voltage of an output buffer of a source driver according to the related art.

As shown in FIG. 1, the output voltage (i.e., the data voltage) output from the output buffer of the source driver depends on the bias current applied to the output buffer.

As examples of the bias voltage, a first bias current Ibias1 and a second bias current Ibias2 can be selectively applied to the output buffer of the source driver. In this case, it can be confirmed that the output voltage of the output buffer is output (or transferred) almost no delay when the first bias current Ibias1 a relatively larger value compared to the second bias current Ibias2 is applied, as shown in FIG. 1.

On the contrary, when the second bias current Ibias2 being smaller than the first bias current Ibias1 is applied, rising and falling edges of the output voltage output from the output buffer are delayed as shown in FIG. 1.

Although a large-sized display panel is driven in a high frame frequency, the source driver using a large bias current Ibias can output an output voltage without any delay. As such, the large bias current applied to the output buffer of the source driver can prevent deterioration of image quality of the display panel.

However, as the bias current applied to the output buffer of the source driver increases, power consumption must become larger.

Also, since the plurality of output buffers is disposed in the source driver, the large bias current Ibias applied to each of the output buffers must generate heat. Due to this, performances of the source driver and the display device must deteriorate.

SUMMARY

Accordingly, embodiments of the present application are directed to a display device and a driving method thereof that substantially obviate one or more of problems due to the limitations and disadvantages of the related art, as well to a light source module and a backlight unit each using the same.

An object of the present invention is to provide a source driver, a display device with the same and a driving method thereof which are adapted to reduce power consumption by adjusting a bias current which is applied to an output buffer disposed in the source driver.

Another object of the present invention is to provide a source driver, a display device with the same and a driving method of thereof which are adapted to prevent the performance deterioration due to the generation of heat by adjusting a bias current according to intervals of an output voltage which is output from an output buffer of the source driver.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

To achieve these and other advantages and in accordance with the purpose of the present invention, as embodied and broadly described, a source driver comprises a shift controller configured to shift a sampling control signal; a latch array configured to sample digital video data in response to the sampling control signal shifted by the shift controller; a digital-to-analog converter array configured to convert the digital video data from the latch array into data voltages by decoding the digital video data and combination-outputting gamma compensation voltages on the basis of a gray value of the decoded data; an output buffer array configured to output the data voltages from the digital-to-analog converter array; and a bias controller configured to adjust a bias current, which is applied to the output buffer array, according to delay and stable intervals of the data voltage. Such a source driver can reduce power consumption by adjusting a bias current which is applied to an output buffer disposed in the source driver.

In another aspect, a display device comprises a display panel configured to include a plurality of pixels arranged in a matrix shape; and a source driver configured to apply data voltages to the pixels. The source driver includes: a shift controller configured to shift a sampling control signal; a latch array configured to sample digital video data in response to the sampling control signal shifted by the shift controller; a digital-to-analog converter array configured to convert the digital video data from the latch array into data voltages by decoding the digital video data and combination-outputting gamma compensation voltages on the basis of a gray value of the decoded data; an output buffer array configured to output the data voltages from the digital-to-analog converter array; and a bias controller configured to adjust a bias current, which is applied to the output buffer array, according to delay and stable intervals of the data voltage. Such a display device can prevent the performance deterioration due to the generation of heat by adjusting a bias current according to intervals of an output voltage which is output from an output buffer of the source driver.

In another aspect, a driving method of a display device can be applied to a display device with a display panel in which a plurality of pixels is arranged in a matrix shape. The display device driving method comprises defining an output period of a data voltage, which is applied from an output buffer of a source driver to the display panel, into a delay interval and a stable interval; applying a first bias current to an output buffer in the delay interval; and applying a second bias current to the output buffer in the stable interval. Such a display device driving method can reduce power consumption by adjusting a bias current which is applied to an output buffer disposed in the source driver.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE ILLUSTRATED EMBODIMENTS

Figure 1:
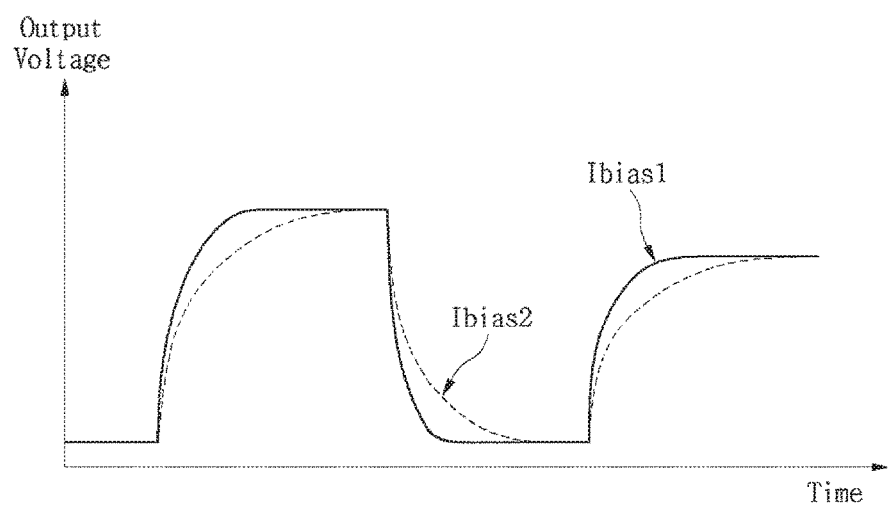
FIG. 1 is a data sheet illustrating properties of an input bias current and an output voltage of an output buffer of a source driver according to the related art.
Figure 1:

Advantages and features of the present disclosure, and implementation methods thereof will be clarified through the following embodiments described with reference to the accompanying drawings. These embodiments introduced hereinafter are provided as examples in order to convey their spirits to the ordinary skilled person in the art. As such, these embodiments might be embodied in a different shape, so are not limited to these embodiments described here. Therefore, the present disclosure must be defined by scopes of claims.

In the following description, numerous specific details are set forth, such as particular structures, sizes, ratios, angles, coefficients and so on, in order to provide an understanding of the various embodiments of the present disclosure. However, it will be appreciated by one of ordinary skill in the art that the various embodiments of the present disclosure may be practiced without these specific details. The same reference numbers will be used throughout this disclosure to refer to the same or like parts. In other instances, well-known technologies have not been described in detail in order to avoid obscuring the present disclosure.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the singular forms "a", an and the are intended to include the plural forms as well, unless the context clearly indicates otherwise.

Elements used in the present disclosure without additional specific details must be considered to include tolerance.

In the description of embodiments, when a structure is described as being positioned "on or above" or "under or below" another structure, this description should be construed as including a case in which the structures contact each other as well as a case in which a third structure is disposed therebetween.

The temporal terms of "after", "subsequently", "next", "before" and so on used in this disclosure without specifying "immediately" or "directly" can include other discontinuously temporal relations.

Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or as third element without departing from the scope of exemplary embodiments.

The features of various exemplary embodiments of the present disclosure may be partially or entirely bound or combined with each other, and be technically engaged and driven using various methods as apparent to those skilled in the art, and the exemplary embodiments may be independently practiced alone or in combination.

Reference will now be made in detail to the embodiments of the present disclosure, examples of which are illustrated in the accompanying drawings. Also, the size and thickness of the device might be expressed to be exaggerated for the sake of convenience in the drawings. Wherever possible, the same reference numbers will be used throughout this disclosure including the drawings to refer to the same or like parts.

Figure 2:
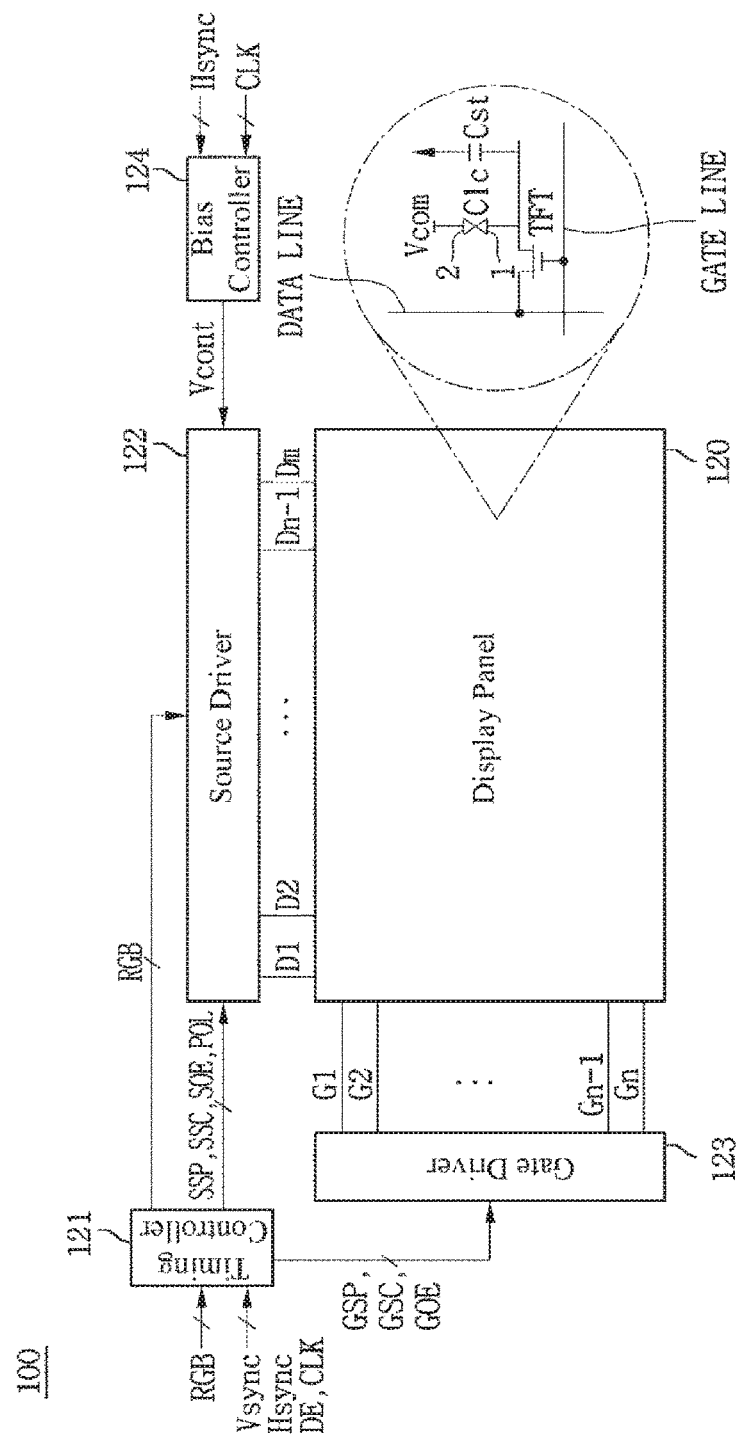
FIG. 2 is a block diagram showing a display device according to an embodiment of the present disclosure.

FIG. 2 is a block diagram showing a display device according to an embodiment of the present disclosure.

Referring to FIG. 2, a display device 100 according to an embodiment of the present disclosure includes a display panel 120, a timing controller 121, a source driver 122, a gate driver 123 and a bias controller 124.

The display device 100 according to an embodiment of the present disclosure can become one of flat panel display devices such as liquid crystal display (LCD) devices, field emission display (FED) devices, plasma display panels (PDPs), organic light emitting diode (OLED) display devices, electrophoresis display (EPD) devices and so on. As an example of the display device 100 of the present embodiment, an LCD device will be mainly described. However, the display device of the present disclosure is not limited to the LCD device.

The display panel 120 includes liquid crystal molecules interposed between two glass substrates. In other words, the display panel 120 includes mxn liquid crystal cells Clc which are defined by crossing data lines D1~Dm and gate lines G1~Gn and arranged in a matrix shape. The 'm' and 'n' are positive integers.

The m data lines D1~Dm, the n gate lines G1~Gn and a pixel array are formed on a lower glass substrate of the display panel 120. The pixel array includes thin film transistors, pixel electrodes 1 of the liquid crystal cells Clc, which are connected to the thin film transistors TFT, a storage capacitors Cst and so on.

A black matrix, a color filter layer and a common electrode 2 are formed on an upper glass substrate of the display panel 120. The common electrode 2 formed on the upper glass substrate allows the display panel 120 to be driven in a vertical field mode such as a twisted nematic or a vertical alignment mode. Alternatively, when the display panel 120 is driven in one of horizontal field modes such as an in-plane switching (IPS) mode, a fringe field switching (FFS) mode and so on, the common electrode 2 together with the pixel electrodes 1 can be formed on the lower glass substrate.

Also, the display panel 120 includes polarizing plates with light axes crossing each other. The polarizing plates are attached on outer surfaces of the lower and upper glass substrates. Moreover, the display panel 120 includes alignment films which are used to set a pretilt angle of the liquid crystal molecules. The alignment films are formed on inner surfaces of the lower and upper glass substrates which come in contact with the liquid crystal cells.

The source driver 122 latches digital video data RGB, converts the latched digital video data RGB into positive/negative data voltages using positive/negative analog gamma voltages, and applies the converted positive/negative data voltages to the data lines D1~Dm. To this end, the source driver 122 is controlled by the timing controller 121.

The source driver 122 can be driven in a low power mode in response to a switching control signal Vcont which is applied from the bias controller 124. In the low power mode, a bias current applied to output buffers which are arranged in an output stage of the source driver 122 can be controlled.

The display device of the present disclosure enables different bias currents opposite to time intervals of the output voltage, which is output from the output buffer of the source driver 122, to be selectively applied to the output buffers of the source driver 122. As such, the power consumption of the source driver 122 can be reduced.

Also, as the controlled bias current is used in the source driver 122, heat generated in the source driver IC chips forming the source driver 122 can be reduced. As such, performance of the source driver 122 can be enhanced.

Such a source driver 122 can be loaded on a tape carrier package (TCP) and bonded on the lower glass substrate of the display panel 120 through a tape automated bonding (TAB) process. This source driver 122 will be described in detail with reference to FIGS. 3 through 5 later.

The gate driver 123 includes a shift register, a level shifter and so on. The level shifter can enable output signals of the shift register to each have a swing width which is suitable to drive the thin film transistors of the liquid crystal cells Clc. Such a gate driver 123 sequentially applies the gate signals to the gate lines G1~Gn under control of the timing controller 121. The gate signals can be scan pulses which each have a pulse width of about single horizontal period.

Also, the gate driver 123 can be loaded on another TCP and bonded to the lower glass substrate of the display panel 120 through the TAB process. Alternatively, the gate driver 123 can be simultaneously formed on the lower glass substrate through a gate-in-panel (GIP) procedure when the pixel array is formed.

The timing controller 121 rearranges digital video data RGB applied from an external system board (not shown) into a format suitable for the display panel 120. The rearranged digital video data RGB is transferred from the timing controller 121 to the source driver 122.

Also, the timing controller 121 inputs timing signals from the external system board. The timing signals includes vertical/horizontal synchronous signals Vsync and Hsync, a data enable signal DE, one of a clock signal CLK and a main clock signal MCLK and so on. The timing controller 121 derives timing control signals from the timing signals. The timing control signals are used to control operation timings of the source driver 122 and the gate driver 123. Also, the control signals generated in the timing controller 121 include data timing control signals and gate timing control signals.

The data timing control signal used to control the source driver 122 includes a source start pulse SSP, a source sampling clock SSC, a polarity control signal POL, a source output enable signal SOE and so on. The source start pulse SSP is used to control a start timing of a data sampling operation of the source driver 122. The source sampling clock SSC is used to control the data sampling operation of the source driver 122. In detail, the source driver 122 samples the digital video data RGB every one of rising and falling edges of the data sampling clock SSC. The source output enable signal SOE is used to control an output timing of the source driver 122. The polarity control signal POL is used to control a horizontal polarity inversion timing of the data voltage being output from the source driver 122.

The gate timing control signals used to control the gate driver 123 includes a gate start pulse GSP, a gate shift clock GSC, a gate output enable signal GOE and so on. The gate start pulse GSP is generated once a frame period at a start time point of the frame period and used to derive a first gate pulse. The gate shift clock GSC is commonly applied to stages which are included in the shift register. Such a gate shift clock GSC is used to shift the gate start pulse GSP along the stages of the shift register. The gate output enable signal GOE is used to control the output time point of the gate driver 123.

The bias controller 124 controls the bias current Ibias applied to the output buffer of the source driver 122 to be adjusted according to a delay interval (or an edge interval) and a stable interval of the output voltage (i.e., a data voltage) which is output from the source driver 122 during the period of a single horizontal synchronous signal Hsync.

To this end, the bias controller 124 can divide the output period of the output voltage output from the output buffer into the delay (or edge) interval and the stable interval by counting a number of clocks included in the single horizontal synchronous signal period Hsync. Also, the bias controller 124 can control the bias voltage applied to the output buffer to be lowered in the stable interval of the output voltage of the output buffer. As such, the power consumption of the source driver 122 can be reduced and the generation of heat in the source driver 122 can be minimized.

Figure 3:
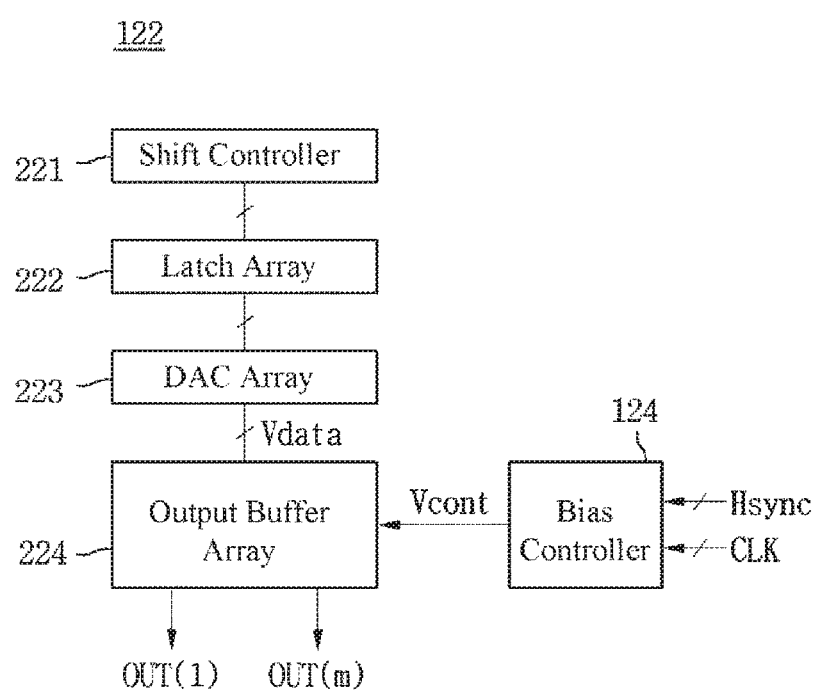
FIG. 3 is a detailed block diagram showing a configuration of the source driver shown in FIG. 2.
Figure 4:
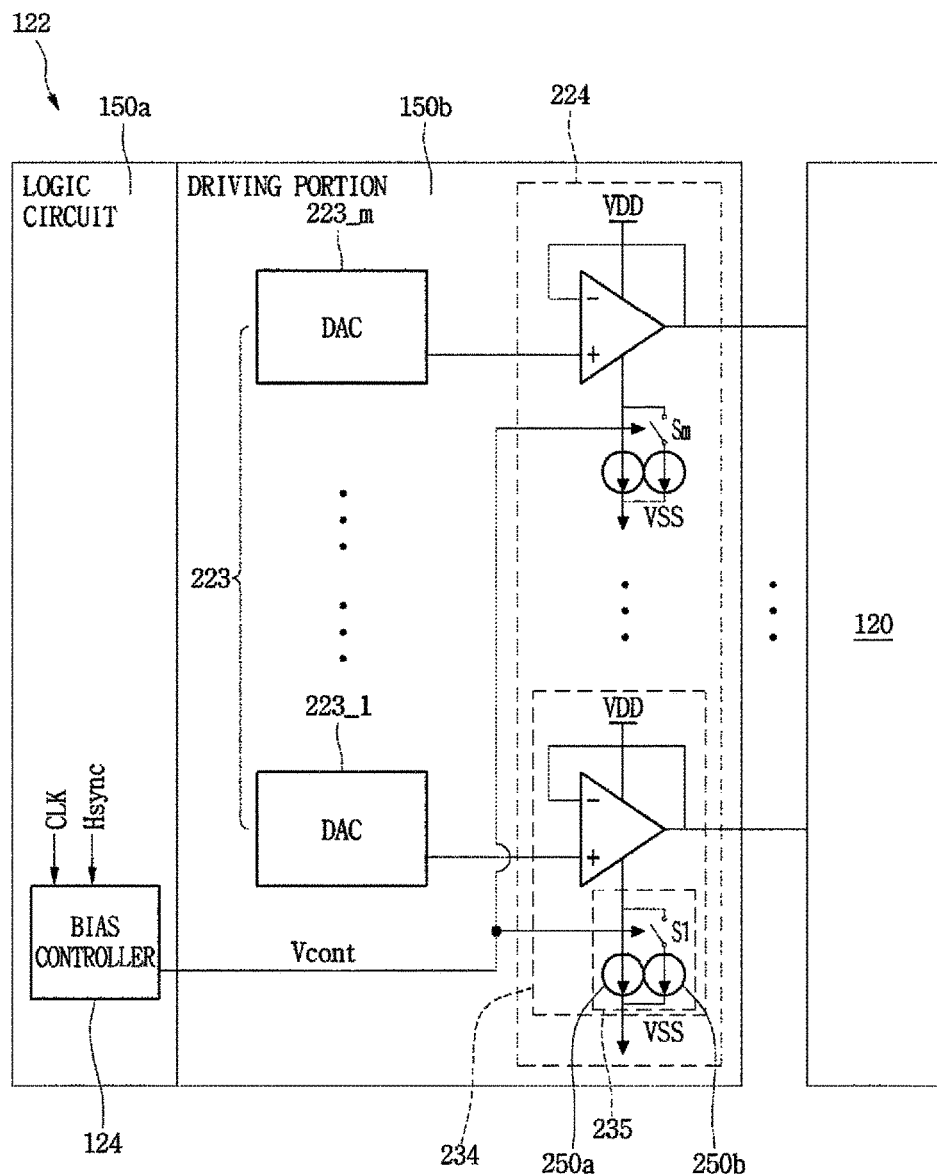
FIG. 4 is a circuit diagram showing configurations of a bias controller and output buffers of the source driver according to an embodiment of the present disclosure.
Figure 5:
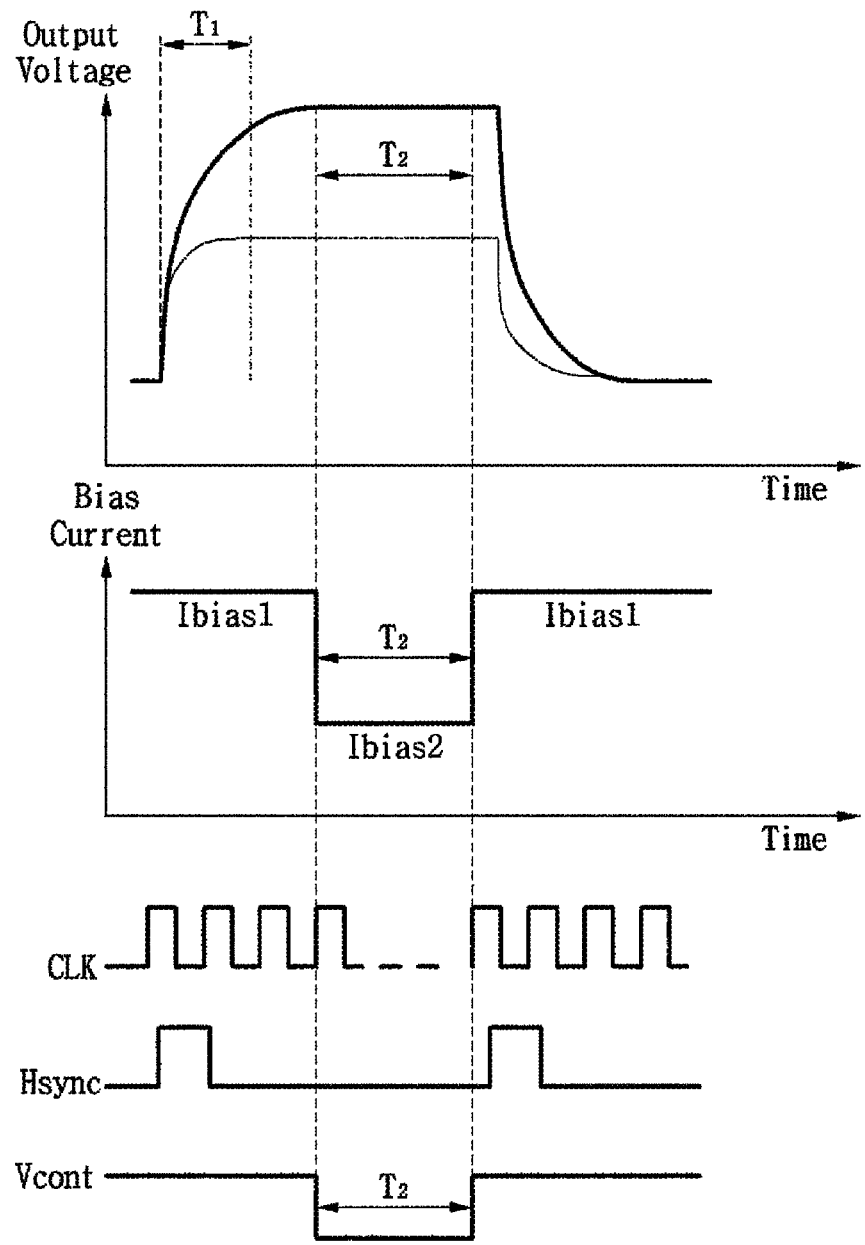
FIG. 5 is a waveform diagram illustrating a bias current, which is controlled by a switching control signal, in accordance with an embodiment of the present disclosure.
Figure 6:
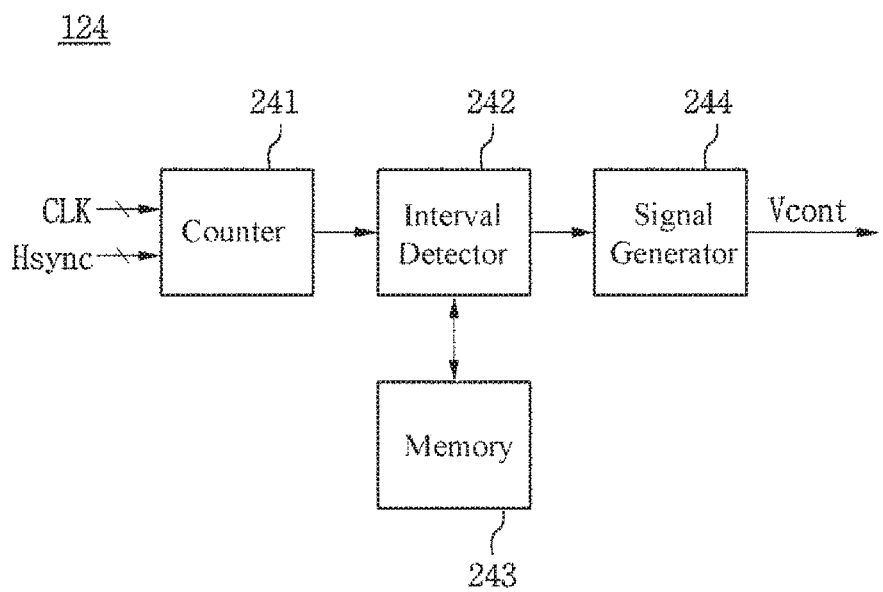
FIG. 6 is a detailed block diagram showing a bias controller according to an embodiment of the present disclosure.

FIG. 3 is a detailed block diagram showing a configuration of the source driver in FIG. 2. FIG. 4 is a detailed circuit diagram showing configurations of output buffers of a source driver and a bias controller according to an embodiment of the present disclosure. FIG. 5 is a waveform diagram illustrating a bias current, which is controlled by a switching control signal, in accordance with an embodiment of the present disclosure. FIG. 6 is a detailed block diagram showing a bias controller according to an embodiment of the present disclosure.

Referring to FIGS. 3 through 5, the source driver 122 can include a shift controller 221, a latch array 222, a digital-to-analog converter (DAC) array 223, an output buffer array 224 and a bias controller 124.

The shift controller 221 can shift a sampling control signal in response to the source sampling clock. Also, the shift controller 221 can generate a carry signal when data in excess of the number of latches of the latch array 222 is applied.

The latch array 222 can sample the digital video data RGB from the timing controller 121 in response to the sampling control signal sequentially shifted by the shift controller 221. Also, the latch array 222 can latch a single line of digital video data when the single horizontal line of digital video data is sampled. As such, the single horizontal line of digital video data RGB can be simultaneously output from the latch array 222.

The DAC array 223 includes m DACs 223_1, 223_2, . . . , 223_m−1 and 223_m. The DAC array decodes the single horizontal line of digital video data RGB from the latch array 222 and combination-outputs positive/negative gamma compensation voltages corresponding to the gray value of the decoded digital video data RGB. In accordance therewith, analog data voltages converted from the digital video data RGB can be output from the DAC array 223.

The output buffer array 224 buffers the data voltages Vdata and outputs the stable data voltages Vdata to the data lines through its output channels OUT(1)~OUT(m). Also, the output buffer array 224 can use an adjusted current Ibias which are controlled by the switching control signal Vcont which is output from the bias controller 124.

Such a source driver 122 can be defined into a logic circuit 150a and a driving portion 150b. The bias controller 124 can be disposed in the logic circuit 150a. The shift controller 221, the latch array 222, the DAC array 223 and the output buffer array 224 can be disposed in the driving portion 150b.

The output buffer array 224 disposed in the driving portion 150b of the source driver 122 includes a plurality of output buffers 234. The output buffers 234 can receive the analog data voltages from the respective DACs 223_1~223_m of the DAC array 223, and output the received data voltages to the data lines on the display panel 120.

The output buffer 234 includes an operational amplifier connected to a high potential voltage line VDD. Also, the output buffer 234 can include a bias supplier 235 configured to apply the adjusted current Ibias. The bias supplier is connected between the operational amplifier and a low potential voltage line VSS.

The output buffers 234 receive the analog data voltages Vdata from the DAC array 223. Also, the output buffer 234 output the analog data voltages Vdata to the data lines on the display panel 120 in synchronization with a horizontal synchronous signal Hsync.

Each of the bias supplier 234 disposed in the output buffer 234 can include a first constant current source 250a, a second constant current source 250b and a switching element S1 or Sm.

The switching element S1 or Sn can be turned-on/off by the switching control signal from the bias controller 124. As such, a first bias current Ibias1 and a second bias current Ibias2 can be selectively applied from the bias supplier 235 of the output buffer 234 to the operational amplifier of the output buffer 234 as a bias current Ibias. The first bias current Ibias1 can be obtained by adding the output currents of the first and second constant current sources 250a and 250b. The second bias current Ibias2 includes only the output current of the first constant current source 250a.

In this way, the source driver 122 of the present disclosure allows the adjusted bias current instead of a constant current to be used in the output buffer 234. In other words, the output buffer 234 receives a low bias current in a time interval when the data voltage is stably maintained without any variation (or distortion). As such, the power consumption of the source driver 122 can be reduced and the generation of heat in the source driver 122 can be minimized.

Although it is shown in the drawings that the first and second constant current sources 250a and 250b are configured in a separate manner, they are configured in a single current source united with each other. The single current source (referring to FIG. 7) can supply the operational amplifier of the output buffer 234 with an adjusted bias current Ibias which has different current values from each other in response to the switching control signal of the bias controller 124.

The bias controller 124 can include a counter 241, an interval detector 242, a memory 243 and a signal generator 244. The counter 241 can use a clock signal CLK and a horizontal synchronous signal Hsync. Alternatively, the source sampling clock SSC and the source output enable signal SOE applied to the source driver 122 instead of the clock signal CLK and the horizontal synchronous signal Hsync can be used as input signals of the counter 241. The counter 241 can count the number of clocks CLK during a single horizontal synchronous signal period using the clock signal CLK and the horizontal synchronous signal Hsync. The memory 243 stores reference clock count values indicating the delay interval T1 and the stable interval T2 of the output voltage applied from the output buffer 234. In other words, the memory 243 can store logic interval information of the switching control signal Vcont. For example, the memory 243 can store reference clock count values which indicate start and end point of the stable interval of the output voltage (i.e., the data voltage) applied from the output buffer 234. The interval detector can detect start and end points of the stable interval T2 of the output voltage of the output buffer 234 from the clock count value of the counter 241 using the reference clock count values which are stored in the memory 243. The start point of the stable interval T2 of the output voltage of the output buffer 234 can correspond to the end point of the delay (or edge) interval T1 of the output voltage of the output buffer 234. The end point of the stable interval T2 of the output voltage of the output buffer 234 can correspond to the start point of the delay (or edge) interval T1 of the output voltage of the output buffer 234. Also, the interval detector 242 can output first and second interval detection signals indicating the start and point points of the stable interval T2 of the output voltage of the output buffer 234. The signal generator 244 can generate the switching control signal Vcont in response to the first and second interval detection signals from the interval detector 242. For example, the switching control signal Vcont can be transitioned from a high level to a low level by the first interval detection signal from the interval detector 242 and then changed from the low level to the high level by the second interval detection signal from the interval detector 242. The switching control signal Vcont can be transferred from the signal generator 244 to the switching element S1~Sm of the bias supplier 235 of the output buffer 234.

As shown in FIG. 5, the output voltage (data voltage) output from the output buffer 234 of the source driver 122 is output in response to the horizontal synchronous signal Hsync or the source output enable signal SOE. As such, the output voltage of the output buffer 234 can be output during a single horizontal synchronous signal period. The output interval of the output voltage of the output buffer 234 can be distinguished into the delay interval T1 and the stable interval T2.

The sum of the delay interval T1 and the stable interval T2 can be defined as an output interval (or period) of the output voltage (data voltage) of the output buffer 234. Alternatively, the delay interval T1 can be set to have a time width in which the output voltage of the output buffer 234 is varied from a base (or a ground) voltage value to about 80~90% of a desired output voltage value (i.e., an output voltage value in the stable interval T2), and the stable interval T2 can be defined to have another width from a time point, at which the output voltage of the output buffer 234 reaches a desired output voltage value, to another time point before the output voltage starts to drop from the desired output voltage value. In this case, third intervals can be interposed between the delay interval T1 and the stable interval T2.

For example, the delay interval T1 can be defined to a time width from a rising edge of the horizontal synchronous signal Hsync to a time point at which the output voltage of the output buffer 234 reaches about 90% of the desired output voltage value. Also, a start point of the stable interval T2 can be set to be a time point when a fixed number of clocks CLK is counted from an endpoint of the delay interval T1.

In this case, the switching element S1~Sm is maintained a turned-on state from the rising edge of the horizontal synchronous signal Hsync to the start point of the stable interval T2. Then, the first bias current Ibias corresponding to the sum of the output currents of the first and second constant current sources 250a and 250b is applied to the operational amplifier of the output buffer 234.

Also, because the number of clocks corresponding to a period from the rising edge to the start point of the stable interval T2 is counted, the bias controller 124 can apply the switching control signal Vcont with a varied logic level to the switching element S1~Sm. As such, the switching element S1~Sm is turned-off in response to the switching control signal Vcont. Then, the second bias current Ibias including only the output current of the first constant current source 250a is applied to the operational amplifier of the output buffer 234.

The output voltage (data voltage) of the output buffer 234 must be rapidly varied from the base voltage value to the desired output voltage value in the delay (rising edge) interval T1, as shown in FIG. 5. As such, the image quality of the display panel 120 is largely affected by the output voltage (data voltage) of the output buffer 234 in the delay interval T1. To address this mater, the first bias current Ibias1 with a relatively large value is applied to the operational amplifier of the output buffer 234.

On the other hand, the output voltage of the output buffer 234 has the desired output voltage value in the stable interval T2. As such, the output voltage of the output buffer 234 can be maintained the desired output voltage value without any delay and variation even though the bias current is varied. In accordance therewith, the second bias current Ibias2 relatively smaller than the first bias current Ibias1 can be applied to the operational amplifier of the output buffer 234 during the stable interval T2. To this end, the switching element S1~Sm is turned-off in response to the switching control signal Vcont with the varied logic level during the stable interval T2.

In this way, the first bias current Ibias1 with the relatively large value can be applied in the delay interval T1 of the output voltage (data voltage) of the output buffer 234. As such, the distortion (delay) of the data voltage applied to the display panel 120 can be minimized.

Also, the second bias current Ibias2 relatively small than the first bias current Ibias1 can be applied to the operational amplifier of the output buffer 234 in the stable interval T2 of the output voltage of the output buffer 234 because the output voltage (data voltage) of the output buffer 234 is hardly affected by the variation of the bias current during the stable interval T2. As such, the power consumption of the source driver 122 can be reduced.

Moreover, the bias current applied to the plurality of output buffers which is disposed in the output buffer array 224 of the source driver 122 can become smaller during a fixed interval (i.e., the stable interval T2). As such, the performance deterioration of the components of the source driver 122 due to the generation of heat can be prevented.

Figure 7:
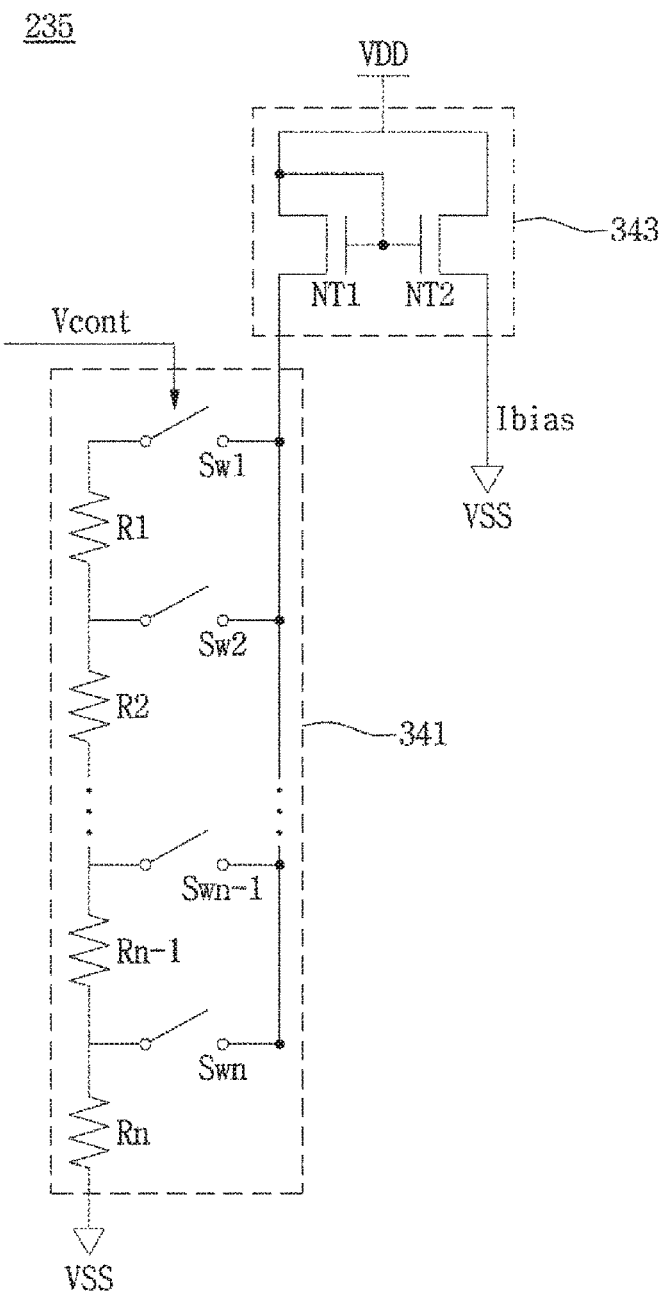
FIG. 7 is a circuit diagram showing another example of the bias supplier in FIG. 4.

FIG. 7 is a circuit diagram showing a second example of the bias supplier in FIG. 4.

Referring to FIGS. 4 and 7, a second example of the bias supplier 235 disposed in the output buffer 234 of the present disclosure includes only a single constant current source connected to the operational amplifier, unlike the first example of the bias supplier shown in FIG. 4.

The bias supplier 235 of FIG. 4 including a pair of constant current sources can supply the operational amplifier of the output buffer 234 with either the first bias current Ibias1 including the output currents of the two constant current sources or the second bias current Ibias2 including only the output current from one of the two constant current sources.

The bias supplier 235 according to the second example including only the single constant current source shown in FIG. 7 can supply the operational amplifier of the output buffer 234 with an adjusted bias current by varying an output current of the single constant current source according to the delay interval T1 and the stable interval T2 of the output voltage of the output buffer 234.

The bias supplier 235 according to the second embodiment of the present disclosure can include a resistor array 341 and a current mirror 343 connected to a high potential voltage line VDD.

The resistor array 341 includes n resistors R1~Rn and n switching elements SW1~SWn. The n resistors R1~Rn are serially connected to the low potential voltage line VSS. The n switching elements SW1~SWn are connected to the respective resistors R1~Rn. Also, the n switching elements SW1~SWn are commonly connected to one output terminal of the current mirror 343.

The current mirror 343 can be configured with a pair of NMOS transistors NT1 and NT2. The n resistors R1~Rn can have the same resistance value. For example, each of the resistors R1~Rn can have a resistance value of 'R'.

The switching control signal Vcont applied from the bias controller 124 can be used to select one of the switching elements SW1~SWn. As such, the switching control signal Vcont can include a plurality of bit signals. For example, the switching control signal Vcont can include n bit signals.

More specifically, the switching control signal Vcont applied from the bias controller 124 to the bias supplier 235 of FIG. 4 is used to turn-on/off the switching elements S1~Sm of the output buffer array 224. However, the switching control signal Vcont applied to the bias supplier 235 of FIG. 7 can be used to select a length of a resistor train in the resistor array 341. In other words, the switching control signal Vcont applied to the bias supplier 235 of FIG. 7 can be used to adjust a resistance value of the resistor array 341.

As such, the current mirror 343 can supply the operational amplifier of the output buffer 234 with an adjusted bias current which is varied by the switching control signal Vcont applied from the bias controller 124.

For example, in the delay interval T1 of the output voltage of the output buffer 234, previously designated one of the switching elements SW1~SWn is selected (or turned-on) in response to the switching control signal Vcont and allows a first bias current Ibias1 to be applied from the current mirror 343 to the operational amplifier of the output buffer 234. On the other hand, in the stable interval T2 of the output voltage of the output buffer 234, previously designated another of the switching elements SW1~SWn is selected (or turned-on) in response to the switching control signal Vcont and enables a second bias current Ibias2 to be applied from the current mirror 343 to the operational amplifier of the output buffer 234.

The second bias current Ibias2 has a small value than that of the first bias current Ibias1.

Such a bias supplier according to second embodiment of the present can supply the output buffer 234 with different bias currents from each other using only the single constant current source. As such, the power consumption of the source driver 122 can be decreased and the number of components of the source driver 122 can be reduced.

Figure 8:
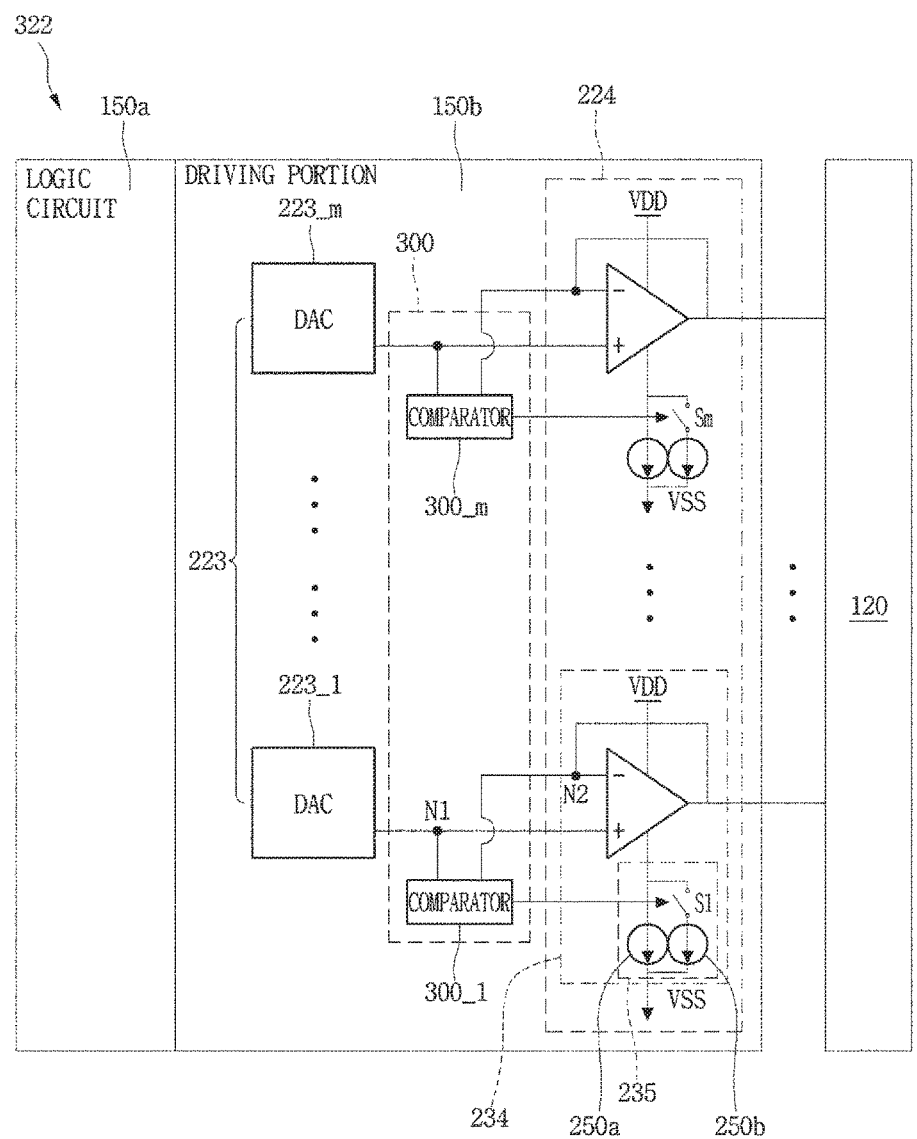
FIG. 8 is a detailed block diagram showing a configuration of the source driver according to another embodiment of the present disclosure.
Figure 9:
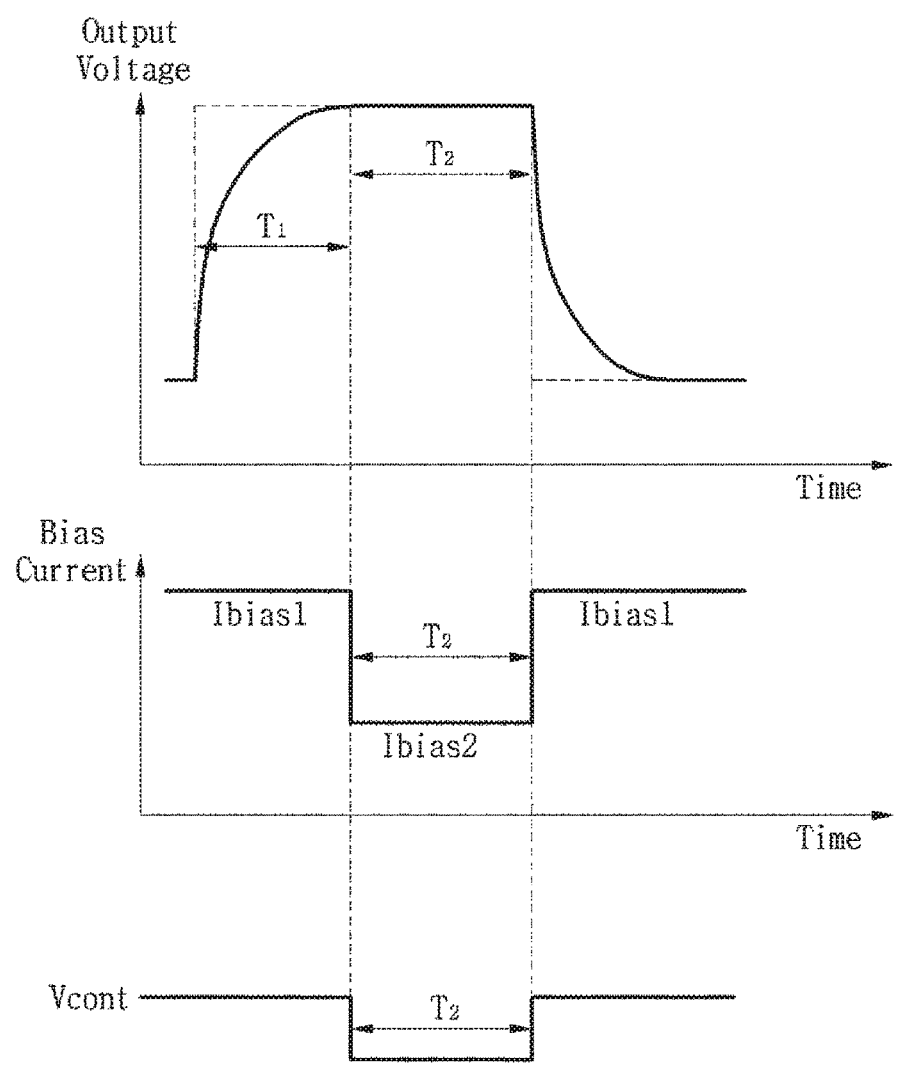
FIG. 9 is a waveform diagram illustrating a bias current, which is controlled by a switching control signal of a comparator, in accordance with an embodiment of the present disclosure.

FIG. 8 is a detailed block diagram showing a configuration of the source driver according to another embodiment of the present disclosure. FIG. 9 is a waveform diagram illustrating a bias current, which is controlled by a switching control signal of a comparator, in accordance with an embodiment of the present disclosure.

The source driver of another embodiment of the present disclosure disposes a comparator in each of the output buffers of the source driver shown in FIG. 4 and adjusts the bias current using the comparator. As such, components of the source driver of another embodiment being the same as those of the source driver shown in FIGS. 2A through 2D will be referred to by the same reference numbers and names. Also, the components of the source driver of another embodiment distinguished from those of the source driver of FIG. 4 will be mainly described.

A display device according to another embodiment of the present disclosure includes a source driver 322 and a display panel 120. Referring to FIGS. 8 and 9, the source driver 322 can be defined into a logic circuit 150a and a driving portion 150b. The driving portion 150b can include a shift controller 221, a latch array 222, a DAC array 223, a comparator array 300 and an output buffer array 224.

The output buffer array 224 disposed in the driving portion 150b of the source driver 322 includes a plurality of output buffers 234 which are disposed opposite to DACs 223_1~223_m included in the DAC array 223.

Each of the output buffers 234 includes an operational amplifier and a bias supplier 235 connected to the operational amplifier and a low potential voltage line VSS. The bias supplier 235 can apply a bias current Ibias to the operational amplifier.

The comparator array 300 of the present disclosure includes a plurality of comparators 300_1~300_m disposed opposite to the output buffers 234. Each of the comparators 300_1~300_m is connected to not only a non-inverting terminal (+) of the operational amplifier of the respective output buffer 234 via a first node N1 but also an inverting terminal (−) of the same operational amplifier via a second node N2.

As such, each of the comparators 300_1~300_m can input a data voltage (hereinafter, 'primary data voltage') at the non-inverting terminal (+) of the operational amplifier of the respective output buffer 234 and a feedback data voltage at the inverting terminal (−) of the same operation amplifier. Also, each of the comparators 300_1~300_m can apply a switching control signal Vcont to the switching element S1~Sm of the bias supplier 235 of the respective output buffer 234.

Each of the operational amplifiers of the output buffers 234 receives the primary data voltage applied from the respective DAC 223 via its non-inverting terminal (+) and supplies the respective data line, which is disposed on the display panel 120, a buffered data voltage corresponding to the feedback data voltage.

Also, each of the comparators 300_1~300_m disposed in the comparator array 300 compares the primary data voltage, which is applied from the respective DAC 223 via the first node N1, with the feedback data voltage applied through the inverting terminal (−) of the respective operational amplifier and the second node N2. If the primary data voltage on the first node N1 (or the non-inverting terminal (+)) is larger or smaller than the feedback data voltage on the second node N2 (or the inverting terminal (−)), each of the comparators 300_1~300_m can output the switching control signal with the high logic value.

The switching element S1~Sm disposed in each of the bias suppliers 235 is turned-on in response to the switching control signal Vcont from the respective comparator 300_1~300_m. Then, a first bias current Ibias1 corresponding to the sum of the output currents of the first and second constant current sources 250a and 250b is applied the bias supplier 235 of the respective output buffer 234 to the operational amplifier of the respective output buffer 234.

On the contrary, the primary data voltage on the first node N1 (or the non-inverting terminal (+)) is almost the same as the feedback data voltage on the second node N2 (or the inverting terminal (−)). In this case, each of the comparators 300_1~300_m can output the switching control signal with the low logic value.

The switching element S1~Sm disposed in each of the bias suppliers 235 is turned-on in response to the switching control signal Vcont of the low logic value from the respective comparator 300_1~300_m. Then, a second bias current Ibias2 including only the output current of the first constant current sources 250a is applied the bias supplier 235 of the respective output buffer 234 to the operational amplifier of the respective output buffer 234, because the output current of the second constant current source 250b is intercepted.

Each of the comparators 300_1~300_m can be configured in a Schmitt trigger mode. For example, if the buffered data voltage output from the output buffer 234 is being increased and a voltage difference between the input and output data voltage of the output buffer 234 (i.e., the primary data voltage and the buffered or feedback data voltage) corresponds to about 5% of the output data voltage of the output buffer 234, the switching control signal Vcont output from each of the comparators 300_1~300_m can have the other logic value different from the previous logic value. Similarly, when the buffered data voltage output from the output buffer 234 is being decreased and a voltage difference between the input and output data voltage of the output buffer 234 (i.e., the primary data voltage and the buffered or feedback data voltage) corresponds to about 5% of the output data voltage of the output buffer 234, the switching control signal Vcont output from each of the comparators 300_1~300_m can have the other logic value different from the previous logic value. As such, the switching elements S1~Sm responsive to the switching control signal Vcont can be stably driven.

If such a voltage deviation corresponding to about 5% of the data voltage is applied to the comparators 300_1~300_m, a delay interval T1 of the output voltage of the output buffer 234 is narrowed but the stable interval T2 of the output voltage of the output buffer 234 is widened, as shown in FIG. 9. The delay interval T1 shown in FIG. 9 is narrower than that shown in FIG. 5, but the stable interval T2 shown in FIG. 9 is wider than that shown in FIG. 5.

As such, the switching control signal Vcont generated in each of the comparators 300_1~300_m maintains the high logic value during the shortened delay interval T1. Also, the switching elements S1~Sm responsive to the switching control signal Vcont with the high logic value are turned-on the shorted delay interval T1. Moreover, each of the bias suppliers 234 applies the first bias current Ibias1 larger than the second bias current Ibias2 to the respective operational amplifier during the shortened delay interval T1.

On the other hand, the switching control signal Vcont generated in each of the comparators 300_1~300_m maintains the low logic value during the lengthened stable interval T2. Also, the switching elements S1~Sm responsive to the switching control signal Vcont with the low logic value are turned-off the lengthened stable interval T2. Moreover, each of the bias suppliers 234 applies the second bias current Ibias2 smaller than the first bias current Ibias1 to the respective operational amplifier during the lengthened stable interval T2.

In accordance therewith, the source driver according to another embodiment of the present disclosure more reduce the power consumption and the generation of heat.

As described above, the source driver, the display device with the same and the driving method thereof according to the present disclosure can reduce power consumption by adjusting a bias current which is applied to an output buffer disposed in the source driver.

Also, the source driver, the display device with the same and the driving method of thereof can prevent the performance deterioration due to the generation of heat by adjusting a bias current according to intervals of an output voltage which is output from an output buffer of the source driver.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A source driver, comprising:
   a shift controller configured to shift a sampling control signal;
   a latch array configured to sample digital video data in response to the sampling control signal shifted by the shift controller;
   a digital-to-analog converter array configured to convert the digital video data from the latch array into data voltages by decoding the digital video data and combination-outputting gamma compensation voltages on the basis of a gray value of the decoded data;
   an output buffer array configured to output the data voltages from the digital-to-analog converter array, at least one of the data voltages having a single edge interval and a single stable interval during a period of a single horizontal synchronous signal; and
   a bias controller configured to adjust a bias current, which is applied to the output buffer array, according to the edge and stable interval s of the at least one of the data voltages,
   wherein the bias controller includes:
   a counter configured to count a number of clock cycles during the period of a single horizontal synchronous signal;
   a memory configured to store information for the edge interval and the stable interval which are included in an output period of the at least one of the data voltages;
   an interval detector configured to detect a start point or an end point of the edge interval or the stable interval on the basis of a count value from the counter and the information stored the memory; and
   a signal generator configured to derive the switching control signal based on the detected start point or end point.

2. The source driver of claim 1, wherein the out buffer array includes a plurality of output buffers, each of which includes:
   an operational amplifier configured to buffer a corresponding one of the data voltages from the digital-to-analog converter array; and
   a bias supplier configured to adjust the bias current in response to a switching control signal from the bias controller and output the adjusted bias current to the operational amplifier.

3. The source driver of claim 2, wherein the bias supplier includes:
   a current mirror configured to supply the bias current to the operational amplifier; and
   a resistor array connected to the current mirror and having a resistance which is adjustable based on the switching control signal,
   wherein the current mirror includes at least two switching elements connected to the resistor array and configured to adjust the bias current based on the resistance of the resistor array.

4. The source driver of claim 2, wherein the bias supplier includes:
   a first constant current source connected to the operational amplifier;
   a second constant current source selectively connected to the operational amplifier in parallel with the first constant current source; and
   a switching element configured to selectively connect the second constant current source to the operational amplifier in response to the switching control signal from the bias controller.

5. The source driver of claim 4, wherein the switching element responsive to the switching control signal is configured to disconnect the second constant current source from the operational amplifier in the stable interval.

6. The source driver of claim 1, wherein the at least one of the data voltages remains substantially constant between a start point and an end point of the stable interval, and
wherein the bias controller is configured to adjust the bias current from a first bias current to a second bias current lower than the first bias current at the start point of the stable interval.

7. A display device, comprising:
a display panel including a plurality of pixels arranged in a matrix shape; and
a source driver configured to apply data voltages to the pixels, the source driver including:
a shift controller configured to shift a sampling control signal;
a latch array configured to sample digital video data in response to the sampling control signal shifted by the shift controller;
a digital-to-analog converter array configured to convert the digital video data from the latch array into data voltages by decoding the digital video data and combination-outputting gamma compensation voltages on the basis of a gray value of the decoded data,
an output buffer array configured to output the data voltages from the digital-to-analog converter array, at least one of the data voltages having a single edge interval and a single stable interval during a period of a single horizontal synchronous signal; and
a bias controller configured to adjust a bias current, which is applied to the output buffer array, according to the edge and stable intervals of the at least one of the data voltages,
wherein the bias controller includes:
a counter configured to count a number of clock cycles during the period of a single horizontal synchronous signal:
a memory configured to store information for the edge interval and the stable interval which are included in an output period of the at least one of the data voltages:
an interval detector configured to detect a start point or an end point of the edge interval or the stable interval on the basis of a count value from the counter and the information stored the memory; and
a signal generator configured to derive the switching control signal based on the detected start point or end point.

8. The display device of claim 7, wherein the output buffer array includes a plurality of output buffers each of which includes:
an operational amplifier configured to buffer a corresponding one of the data voltages from the digital-to-analog converter array; and
a bias supplier configured to adjust the bias current in response to a switching control signal from the bias controller and output the adjusted bias current to the operational amplifier.

9. The display device of claim 8, wherein the bias supplier includes:
a current mirror configured to supply the bias current to the operational amplifier; and
a resistor array connected to the current mirror and having a resistance which is adjustable based on the switching control signal,
wherein the current mirror includes at least two switching elements connected to the resistor array and configured to adjust the bias current based on the resistance of the resistor array.

10. The display device of claim 8, wherein the bias supplier includes:
a first constant current source connected to the operational amplifier;
a second constant current source selectively connected to the operational amplifier in parallel with the first constant current source; and
a switching element configured to selectively connect the second constant current source to the operational amplifier in response to the switching control signal from the bias controller.

11. The display device of claim 10, wherein the switching element responsive to the switching control signal is configured to disconnect the second constant current source from the operational amplifier in the stable interval.

12. The display device of claim 7, wherein the at least one of the data voltages remains substantially constant between a start point and an end point of the stable interval, and
wherein the bias controller is configured to adjust the bias current from a first bias current to a second bias current lower than the first bias current at the start point of the stable interval.

13. The display device of claim 12, wherein the bias controller is further configured to adjust the bias current from the second bias current to the first bias current at the end point of the stable interval.

14. A method of driving a display device with a display panel in which a plurality of pixels is arranged in a matrix shape, and a source driver including a shift controller, a latch array, and a digital-to-analog converter array, the method comprising:
defining an output period of a data voltage, which is applied from an output buffer of a source driver of the display device to the display panel, into a single edge interval and a single stable interval in a period of a single horizontal synchronous signal;
applying a first bias current as a bias current to the output buffer in the edge interval; and
adjusting the bias current applied to the output buffer from the first bias current to a second bias current lower than the first bias current at a starting point of the stable interval,
wherein the adjusting of the bias current includes:
counting a number of clock cycles during the period of a single horizontal synchronous signal;
storing information in a memory for the edge interval and the stable interval which are included in the output period of the data voltage;
detecting a start point or an end point of the edge interval or the stable interval on the basis of a count value from the counter and the information stored the memory;
and deriving a switching control signal based on the detected start point or end point.

15. The method of claim 14, further comprises generating a control signal to switch the bias current between the first and second bias currents based on a horizontal synchronous signal and a clock signal.

16. The method of claim 14, further comprises generating a control signal to switch the bias current between the first and second bias currents based on an input signal of the output buffer and the data voltage.

17. The method of claim 14, further comprising adjusting the bias current from the second bias current to the first bias current at the end point of the stable interval, and wherein the data voltage rises or falls during the edge interval.

18. The method of claim 14, wherein the defining includes setting the edge interval as an interval in which the data voltage varies from base voltage value to between 80% and 90% of a voltage value in the stable interval.

* * * * *